United States Patent
Maruyama et al.

(10) Patent No.: US 8,658,341 B2
(45) Date of Patent: Feb. 25, 2014

(54) PATTERN REVERSAL FILM FORMING COMPOSITION AND METHOD OF FORMING REVERSED PATTERN

(75) Inventors: Daisuke Maruyama, Toyama (JP); Hiroaki Yaguchi, Toyama (JP); Yasushi Sakaida, Toyama (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 80 days.

(21) Appl. No.: 13/266,034

(22) PCT Filed: Apr. 21, 2010

(86) PCT No.: PCT/JP2010/057081
§ 371 (c)(1),
(2), (4) Date: Oct. 24, 2011

(87) PCT Pub. No.: WO2010/123032
PCT Pub. Date: Oct. 28, 2010

(65) Prior Publication Data
US 2012/0045899 A1  Feb. 23, 2012

(30) Foreign Application Priority Data
Apr. 24, 2009 (JP) ................. 2009-106240

(51) Int. Cl.
G03F 7/00 (2006.01)
G03F 7/004 (2006.01)
G03F 7/028 (2006.01)
G03F 7/075 (2006.01)
G03F 7/11 (2006.01)

(52) U.S. Cl.
USPC ............. 430/270.1; 430/271.1; 430/272.1; 430/273.1; 430/913; 430/927

(58) Field of Classification Search
USPC ............. 430/270.1, 271.1, 273.1, 272.1, 913, 430/927
See application file for complete search history.

(56) References Cited

U.S. PATENT DOCUMENTS 7,745,094 B2 * 6/2010 Nakashima et al. ....... 430/270.1
2004/0102048 A1  5/2004 Yamaguchi
(Continued)

FOREIGN PATENT DOCUMENTS

EP   2063319 A1 * 5/2009
JP   A-2002-110510  4/2002
(Continued)

OTHER PUBLICATIONS

Written Opinion issued in International Patent Appln. No. PCT/JP2010/057081; mailed May 25, 2010.
International Search Report issued in International Patent Appln. No. PCT/JP2010/057081; mailed May 25, 2010.

*Primary Examiner* — Amanda C. Walke
(74) *Attorney, Agent, or Firm* — Oliff PLC

(57) ABSTRACT

There is provided to a pattern reversal film forming composition that is capable of forming a pattern reversal film which is not mixed with a resist pattern formed on a substrate, and that is only capable of forming a pattern reversal film advantageously covering the pattern, but also irrespective of whether the resist pattern is coarse or fine, capable of forming a planar film excellent in temporal stability on the pattern. A pattern reversal film forming composition including a polysiloxane, an additive and an organic solvent, characterized in that the polysiloxane is a product of a hydrolysis and/or condensation reaction of a silane compound containing a tetraalkoxysilane of $Si(OR^1)_4$ and an alkoxysilane of $X_n Si(OR^2)_{4-n}$, and the tetraalkoxysilane is used in a ratio of 1 to 50% by mole based on the number of moles of the whole silane compound; and a pattern reversal film and a method of forming a reversed pattern in which the composition is used.

13 Claims, 2 Drawing Sheets

(56) References Cited

U.S. PATENT DOCUMENTS

2007/0190458 A1* 8/2007 Nakashima et al. ....... 430/270.1
2008/0292976 A1 11/2008 Terasaki et al.
2009/0136869 A1* 5/2009 Ogihara et al. ............ 430/270.1

FOREIGN PATENT DOCUMENTS

| JP | A-2004-179254 | 6/2004 |
| JP | A-2008-287176 | 11/2008 |
| JP | A-2008-290316 | 12/2008 |

* cited by examiner

PATTERN REVERSAL FILM FORMING COMPOSITION AND METHOD OF FORMING REVERSED PATTERN

TECHNICAL FIELD

The present invention relates to a pattern reversal film forming composition, a pattern reversal film using the composition, and a method of forming a reversed pattern using the composition. Further in detail, the present invention provides a pattern reversal film forming composition capable of forming a planar film and having advantageous coatability on a resist pattern irrespective of whether the resist pattern formed on a substrate to be processed is coarse or fine.

BACKGROUND ART

In a production process of a semiconductor element, a photoresist pattern is formed through a photoresist applying process, a pre-baking process, an exposure process, a post-baking process, and a resist developing process.

In recent years, following high-integration of semiconductor elements, the miniaturization of the photoresist pattern has been increasingly required, and as a pattern forming method attempting a highly precise dimension control, there are disclosed a forming method of a reversed mask pattern and a resin composition for pattern reversal used during the above forming method (Patent Document 1 and Patent Document 2).

RELATED-ART DOCUMENT

Patent Document

Patent Document 1: Japanese Patent Application Publication No. JP-A-2002-110510
Patent Document 2: Japanese Patent Application Publication No. JP-A-2008-287176

DISCLOSURE OF THE INVENTION

Problem to be Solved by the Invention

It is an object of the present invention to provide a pattern reversal film forming composition having advantageous coatability on a resist pattern irrespective of whether the resist pattern formed on a substrate is coarse or fine and not only capable of forming a pattern reversal film advantageously covering the pattern, but also capable of forming a planar film excellent in temporal stability on any one of a dense pattern, a semi-dense pattern, and an isolated pattern where the formed film is not mixed with the resist pattern formed on a substrate.

Means for Solving the Problem

As a result of assiduous research intended to overcome these disadvantages, the inventors of the present invention have found that by preparing a composition including a polysiloxane synthesized from a silane compound in which a tetraalkoxysilane of Formula (1) and an alkoxysilane of Formula (2) are blended each in a specific blending ratio, there can be obtained a pattern reversal film forming composition capable of achieving the formation of a planar film on various patterns, having advantageous stability after the film formation, and capable of suppressing mixing with a resist pattern, and have completed the present invention.

That is, the present invention relates to, according to a first aspect, a pattern reversal film forming composition containing a polysiloxane, an additive, and an organic solvent, characterized in that the polysiloxane is a product of a hydrolysis and/or condensation reaction of a silane compound containing a tetraalkoxysilane of Formula (1):

$$Si(OR^1)_4 \qquad (1)$$

(where $R^1$s are independently a $C_{1-4}$ alkyl group) and an alkoxysilane of Formula (2):

$$X_nSi(OR^2)_{4-n} \qquad (2)$$

(where X is a $C_{1-9}$ hydrocarbon group; $R^2$s are independently a $C_{1-4}$ alkyl group; and n is an integer of 1 to 3), and the tetraalkoxysilane is used in a ratio of 1 to 50% by mole based on the number of moles of the whole silane compound.

According to a second aspect, the present invention relates to the pattern reversal film forming composition according to the first aspect, in which the tetraalkoxysilane is tetraethoxysilane.

According to a third aspect, the present invention relates to the pattern reversal film forming composition according to the first aspect, in which the organic solvent is selected from a group consisting of $C_{4-10}$ alcohols and $C_{4-10}$ ethers.

According to a fourth aspect, the present invention relates to the pattern reversal film forming composition according to the first aspect, in which the additive includes at least one selected from a group consisting of a pH controller, a condensation accelerator, a surfactant, a photoacid generator, and a quencher.

According to a fifth aspect, the present invention relates to a method of forming a pattern reversal film including the process of forming a film by applying the pattern reversal film forming composition as described in any one of the first aspect to the fourth aspect on a step substrate and by maintaining the resultant product at room temperature or by baking the resultant product at a temperature beyond room temperature up to 180° C.

According to a sixth aspect, the present invention relates to the method of forming a pattern reversal film according to the fifth aspect, in which the step substrate is a substrate with a surface having a resist pattern formed thereon.

According to a seventh aspect, the present invention relates to a method of forming a reversed pattern including the processes of: forming a resist pattern on a substrate to be processed; applying the pattern reversal film forming composition as described in any one of the first aspect to the fourth aspect on the resist pattern so as to coat the pattern of the resist pattern to form a pattern reversal film; etching back the pattern reversal film to expose the surface of the resist pattern; and removing the resist pattern to form a reversed pattern.

Effects of the Invention

The pattern reversal film forming composition of the present invention can form a pattern reversal film having substantially no film loss after the film formation and being excellent in temporal stability. Further, the pattern reversal film forming composition has advantageous coatability on a resist pattern formed on a substrate to be processed and can form a pattern reversal film capable of advantageously covering the resist pattern. Moreover, the pattern reversal film forming composition of the present invention can form a planar film even on a substrate having a coarse-fine pattern formed thereon. In addition, the pattern reversal film forming composition of the present invention can form a reversed pattern suppressing intermixing with a resist pattern.

The method of forming a pattern reversal film of the present invention using the pattern reversal film forming composition can form a pattern reversal film having advantageous coatability on a pattern, being planar and excellent in temporal stability, and suppressing intermixing with a resist pattern on various patterns.

Accordingly, by the method of forming a reversed pattern of the present invention, after an etching process for exposing the surface of a resist pattern coated by formation of a pattern reversal film, the film thickness of the pattern reversal film becomes substantially homogeneous irrespective of whether the resist pattern is coarse or fine, and through an etching operation of the resist pattern, a minute reversed pattern having a high dimension precision can be formed.

Thus, in the production of LSI, in which the miniaturization is regarded as being hereafter further progressed, the pattern reversal film forming composition, the method of forming a pattern reversal film, and the method of forming a reversed pattern of the present invention can be extremely suitably used for forming a minute contact hole, a minute short trench, or the like having a high pattern density, of which dimension is lower than the resolution lower limit of the photolithography method or of which wide process margin cannot be obtained.

BEST MODES FOR CARRYING OUT THE INVENTION

Figure 1:
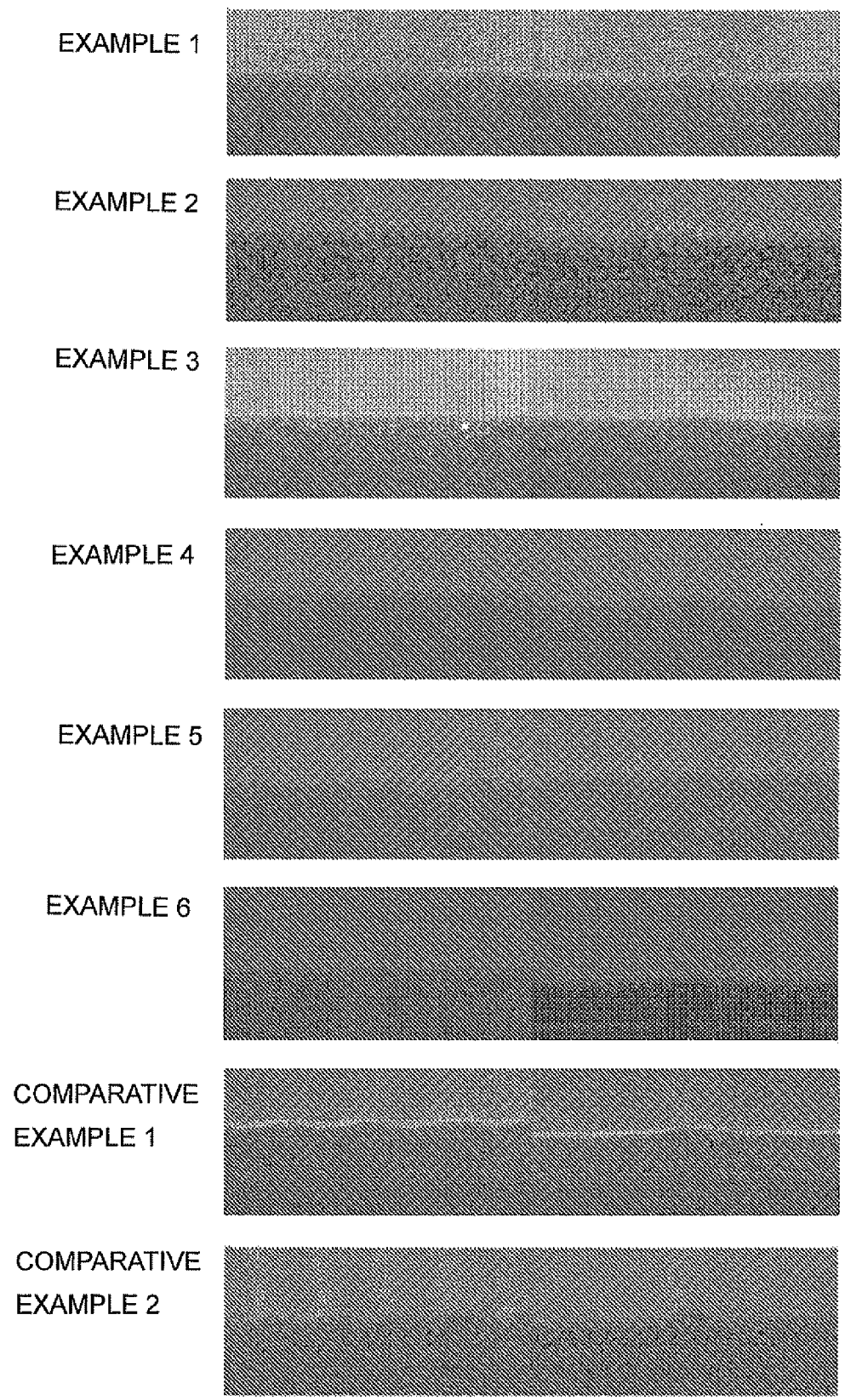
FIG. 1 shows SEM images of the pattern reversal films obtained using the pattern reversal film forming compositions of Example 1 to Example 6 and Comparative Example 1 and Comparative Example 2.

Hereinafter, the mode for carrying out the present invention will be described in detail.
[Pattern Reversal Film Forming Composition]
<Polysiloxane>

The polysiloxane contained in the pattern reversal film forming composition of the present invention is a product of a hydrolysis and/or condensation reaction of a silane compound containing a tetraalkoxysilane of Formula (1):

(where $R^1$s are independently a $C_{1-4}$ alkyl group)
and an alkoxysilane of Formula (2):

(where X is a $C_{1-9}$ hydrocarbon group; $R^2$s are independently a $C_{1-4}$ alkyl group; and n is an integer of 1 to 3).

In Formula (1), $R^1$ is a methyl group, an ethyl group, an n-propyl group, an isopropyl group, an n-butyl group, an isobutyl group, or a tert-butyl group, preferably a methyl group or an ethyl group.

Examples of the tetraalkoxysilane of Formula (1) include tetramethoxysilane, tetraethoxysilane, tetra-n-propoxysilane, and tetraisopropoxysilane.

Among them, preferred are tetramethoxysilane and tetraethoxysilane.

These tetraalkoxysilanes of Formula (1) may be used individually or in combination of two or more types thereof.

Although X in Formula (2) is not particularly limited, preferred examples thereof include: an alkyl group such as a methyl group, an ethyl group, and a propyl group; an alkenyl group such as a vinyl group, an ally group, a 1-propenyl group, and an isopropenyl group; an alkynyl group such as a propynyl group and an ethynyl group; an aryl group such as a phenyl group and a tolyl group; and an aralkyl group such as a benzyl group and a phenylethyl group. More preferred examples thereof include a methyl group, an ethyl group, and a phenyl group.

$R^2$ is a methyl group, an ethyl group, an n-propyl group, an isopropyl group, an n-butyl group, an isobutyl group, or a tert-butyl group, preferably a methyl group or an ethyl group.

Examples of the alkoxysilane of Formula (2) include a methyltrialkoxysilane such as methyltrimethoxysilane, methyltriethoxysilane, methyltri-n-propoxysilane, methyltriisopropoxysilane, methyltri-n-butoxysilane, methyltriisobutoxysilane, and methyltri-tert-butoxysilane; an ethyltrialkoxysilane such as ethyltrimethoxysilane, ethyltriethoxysilane, ethyltri-n-propoxysilane, ethyltriisopropoxysilane, ethyltri-n-butoxysilane, ethyltriisobutoxysilane, and ethyltri-tert-butoxysilane; a phenyltrialkoxysilane such as phenyltrimethoxysilane, phenyltriethoxysilane, phenyltri-n-propoxysilane, phenyltriisopropoxysilane, phenyltri-n-butoxysilane, phenyltriisobutoxysilane, and phenyltri-tert-butoxysilane; a dimethyldialkoxysilane such as dimethyldimethoxysilane, dimethyldiethoxysilane, dimethyldi-n-propoxysilane, dimethyldiisopropoxysilane, dimethyldi-n-butoxysilane, dimethyldiisobutoxysilane, and dimethyldi-tert-butoxysilane; a diethyldialkoxysilane such as diethyldimethoxysilane, diethyldiethoxysilane, diethyldi-n-propoxysilane, diethyldiisopropoxysilane, diethyldi-n-butoxysilane, diethyldiisobutoxysilane, and diethyldi-tert-butoxysilane; and a diphenyldialkoxysilane such as diphenyldimethoxysilane, diphenyldiethoxysilane, diphenyldi-n-propoxysilane, diphenyldiisopropoxysilane, diphenyldi-n-butoxysilane, diphenyldiisobutoxysilane, and diphenyldi-tert-butoxysilane.

Among them, methyltrimethoxysilane, methyltriethoxysilane, phenyltrimethoxysilane, and phenyltriethoxysilane are preferred.

These alkoxysilanes of Formula (2) may be used individually or in combination of two or more types thereof.

In a hydrolysis and/or condensation reaction of a silane compound containing a tetraalkoxysilane of Formula (1) and an alkoxysilane of Formula (2), the ratio of the tetraalkoxysilane of Formula (1) is 1 to 50% by mole, preferably 10 to 50% by mole, more preferably 30 to 50% by mole, based on the number of moles of the whole silane compound.

As the production method of the polysiloxane, the silane compound containing the tetraalkoxysilane of Formula (1) and the alkoxysilane of Formula (2) that are blended at the above blending ratio is subjected to hydrolysis and/or condensation by a method including: dissolving the silane compound in a solvent; adding water and a catalyst to the resultant solution at room temperature; and then mixing the resultant mixture at a temperature of ordinarily 0 to 100° C.

Examples of the catalyst used for the hydrolysis and condensation reaction include an organic acid, an inorganic acid, an organic base, an inorganic base, and an organic chelate compound. Among them, an acid catalyst is preferred and examples of the acid catalyst include an inorganic acid such as hydrochloric acid, nitric acid, and phosphoric acid, and an organic acid, for example, a carboxylic acid such as formic acid, oxalic acid, fumaric acid, maleic acid, glacial acetic acid, acetic anhydride, propionic acid, and n-butyric acid.

As the solvent used here, a solvent used generally for the synthesis of a polysiloxane can be used, and for example, an organic solvent used for the pattern reversal film forming composition described below can be used. Accordingly, the prepared polysiloxane-containing solution can be used as it is for the preparation of the pattern reversal film forming composition.

Although the concentration of the polysiloxane in the pattern reversal film forming composition of the present invention can be accordingly adjusted, examples of the concentration include a concentration of 1 to 30% by mass, particularly a concentration of 5 to 20% by mass.

<Organic Solvent>

The organic solvent contained in the pattern reversal film forming composition of the present invention is preferably selected from a group consisting of $C_{4-10}$ alcohols and $C_{4-10}$ ethers. The organic solvent may further contain a resist solvent so long as intermixing with a resist pattern is not caused.

Although the $C_{4-10}$ alcohols are not particularly limited, preferred examples thereof include butanol, pentanol, cyclopentanol, hexanol, cyclohexanol, and 4-methyl-2-pentanol.

Although the $C_{4-10}$ ethers are not particularly limited, preferred examples thereof include propylene glycol-n-propyl ether, propylene glycol-n-butyl ether, propylene glycol phenyl ether, dipropylene glycol-n-propyl ether, dipropylene glycol-n-butyl ether, dipropylene glycol dimethyl ether, and tripropylene glycol methyl ether.

Although the resist solvent is not particularly limited, preferred examples thereof include methyl lactate, ethyl lactate, acetone, propylene glycol monomethyl ether acetate, and propylene glycol monomethyl ether.

<Other Additives>

Further, the pattern reversal film forming composition of the present invention may contain, if desired, various additives such as a pH controller (an organic acid such as maleic acid), a condensation accelerator (a quaternary ammonium salt such as benzyltriethylammonium chloride), a surfactant, a photoacid generator (an onium salt compound such as a sulfonium salt and an iodonium salt), and a quencher (such as a tertiary amine reacted with an acid).

The surfactant is an additive for enhancing the coatability of the pattern reversal film forming composition. A publicly known surfactant such as a nonionic surfactant and a fluorinated surfactant can be used, and the surfactant can be blended in the pattern reversal film forming composition of the present invention in an amount of, for example, 0.01% by mass or more and 0.5% by mass or less, for example, 0.2% by mass or less, preferably 0.1% by mass or less, based on the mass of the pattern reversal film forming composition of the present invention.

Specific examples of the surfactant include: nonionic surfactants, for example polyoxyethylene alkyl ethers such as polyoxyethylene lauryl ether, polyoxyethylene stearyl ether, polyoxyethylene cetyl ether, and polyoxyethylene oleyl ether, polyoxyethylene alkylarylethers such as polyoxyethylene octylphenol ether and polyoxyethylene nonylphenol ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorinated surfactants, for example EFTOP EF301, EF303, and EF352 (manufactured by Mitsubishi Materials Electronic Chemicals Co., Ltd. (formerly, Jemco Inc.)), MEGAFAC F171, F173, and R-30 (manufactured by DIC Corporation), Fluorad FC430 and FC431 (manufactured by Sumitomo 3M Limited), AsahiGuard AG710 and Surflon S-382, SC101, SC102, SC103, SC104, SC105, and SC106 (manufactured by Asahi Glass Co., Ltd.); and Organosiloxane polymer KP341 (manufactured by Shin-Etsu Chemical Co., Ltd.).

These surfactants may be used individually or in combination of two or more types thereof.

[Method of Forming Pattern Reversal Film]

The method of forming a pattern reversal film of the present invention is a method including a process of applying the pattern reversal film forming composition on a step substrate and maintaining the resultant coating at room temperature or baking the resultant coating at a temperature beyond room temperature up to 180° C. to form a film. The step substrate is preferably a substrate with a surface having a resist pattern formed thereon.

[Method of Forming Reversed Pattern]

The method of forming a reversed pattern of the present invention includes (a) a process of forming a resist pattern on a substrate to be processed, (b) a process of applying the pattern reversal film forming composition on the resist pattern so as to coat the resist pattern to form a pattern reversal film, (c) a process of etching back the pattern reversal film to expose the surface of the resist pattern, and (d) a process of removing the resist pattern to form a reversed pattern.

(a) the process of forming a resist pattern on a substrate to be processed forms first a resist film by applying a resist material on a substrate to be processed by an appropriate coating method such as a spinner and a coater and drying the resultant coating at a temperature of ordinarily around 30° C. to 200° C. At this time, the film thickness of the resist is ordinarily 10 to 1,000 nm.

Then, through a mask of a predetermined pattern, the resist film is exposed to light using a light source such as a visible light ray, an ultraviolet ray, and an X-ray, and the exposed part is developed by a developer. Then, if necessary, the resist film is subjected to Post Exposure Bake (PEB) to form a predetermined resist pattern.

As the substrate to be processed, there can be used a substrate used for the production of a precise integrated circuit element (for example, a semiconductor substrate such as a silicon coated with a silicon oxide film, a silicon nitride film, or a silicon oxide nitride film, a silicon nitride substrate, a quartz substrate, a glass substrate (including a non-alkali glass, a low-alkali glass, and a crystallized glass), and a glass substrate on which an ITO film is formed).

Here, if desired, there can also be used a substrate to be processed on which an organic or inorganic anti-reflective coating is formed beforehand.

As the resist material, both of a negative-type resist and a positive-type resist can be used. Examples of the resist include: a positive-type resist made of a novolac resin and 1,2-naphthoquinonediazide sulfonic acid ester; a chemical amplification-type resist made of a binder having a group elevating the alkali dissolving rate by being decomposed by a photoacid generator and an acid; a chemical amplification-type resist made of an alkali-soluble binder and a low molecule compound elevating the alkali dissolving rate of a resist by being decomposed by a photoacid generator and an acid; and a chemical amplification-type resist made of a binder having a group elevating the alkali dissolving rate by being decomposed by a photoacid generator and an acid and a low molecule compound elevating the alkali dissolving rate of a resist by being decomposed by an acid. Examples of the resist include trade names: PAR710 and PAR855 manufactured by Sumitomo Chemical Co., Ltd., and trade name: AR2772JN manufactured by JSR Corporation. The examples also include fluorine atom-containing polymer-based resists described in Proc. SPIE, Vol. 3999, 330-334 (2000), Proc. SPIE, Vol. 3999, 357-364 (2000), and Proc. SPIE, Vol. 3999, 365-374 (2000).

Examples of the developer for the resist include an aqueous solution of alkalis, for example: inorganic alkalis such as sodium hydroxide, potassium hydroxide, sodium carbonate, sodium silicate, sodium meta-silicate, and ammonia water; primary amines such as ethylamine and n-propylamine; secondary amines such as diethylamine and di-n-butylamine; tertiary amines such as triethylamine and methyldiethylamine; alcohol amines such as dimethylethanolamine and triethanolamine; a quaternary ammonium salt such as tetramethylammonium hydroxide, tetraethylammonium hydroxide, and choline; and cyclic amines such as pyrrole and piperidine. Further, to an aqueous solution of the alkali, an appropriate amount of alcohols such as isopropyl alcohol or a surfactant such as a nonionic surfactant can be added to be used. Among them, a preferred developer is a quaternary ammonium salt aqueous solution, a further preferred developer is a tetramethylammonium hydroxide aqueous solution.

Here, after the resist film has been developed with a developer containing an alkaline aqueous solution, the resist film is generally washed with water, is dried, and is subjected to a next process.

(b) the process of applying the pattern reversal film forming composition on a resist pattern so as to coat the resist pattern to form a pattern reversal film, which is subsequently performed, is performed by applying the pattern reversal film forming composition on a substrate (step substrate) with a surface having a resist pattern formed thereon by an appropriate coating method such as a spinner and a coater. Then, the resultant coating is maintained at room temperature or is baked at a temperature beyond room temperature up to 180° C. to form a pattern reversal film. Here, in this specification, room temperature is defined as 23° C.

By baking the coating at preferably 80 to 180° C., more preferably 80 to 150° C., an organic solvent in the coating film can be rapidly volatilized. The baking time at this time is ordinarily 10 seconds to 300 seconds, preferably 30 seconds to 180 seconds.

Although the film thickness of the pattern reversal film is not particularly limited, the film thickness is ordinarily 10 to 1,000 nm, preferably 50 to 500 nm, Then, (c) the process of etching back the pattern reversal film to expose the surface of the resist pattern and (d) the process of removing the resist pattern to form a reversed pattern, are performed. More in detail, the pattern reversal film formed as described above is subjected to etching back treatment until the surface of the resist pattern is exposed, and then, by removing the resist pattern by $O_2$ etching, a desired reversed pattern is formed.

Examples of the etching back treatment include dry etching using a fluorine-based gas such as $CF_4$, wet etching using an aqueous solution of an organic acid or an organic base, or an organic solvent, and a CMP method. The treating conditions for the etching back treatment can be accordingly adjusted.

For removal of the resist pattern, a publicly known dry etching apparatus can be used and the treating conditions for dry etching can be accordingly adjusted.

As described above, the method of forming a pattern reversal film of the present invention forms a pattern reversal film using the pattern reversal film forming composition, so that a planar pattern reversal film excellent in temporal stability is formed on a step substrate. Then, when the above composition is applied on the substrate on which the resist pattern is formed, the composition has advantageous coatability on the resist pattern and intermixing of the resist pattern with the composition is suppressed.

Accordingly, the method of forming a reversed pattern of the present invention can form a stable and planar pattern reversal film causing substantially no film loss after the film formation even on a pattern formed having various densities.

Then, the reversed pattern obtained through the subsequent process can obtain a minute and highly precise pattern.

EXAMPLES

Hereinafter, the present invention will be described in detail referring to Examples, which should not be construed as limiting the scope of the present invention. The expressions of "part" and "%" are based on the mass unless defined otherwise.

Here, the weight average molecular weight described in Synthesis Examples below of the present specification is the result of the measurement by gel permeation chromatography (hereinafter, abbreviated as GPC). The used measuring apparatus and measuring conditions and the like are as follows.

[GPC Conditions]
GPC apparatus: HLC-8220GPC (manufactured by Tosoh Corporation)
GPC column: Shodex [registered trade mark] KF803L, KF802, KF801 (manufactured by Showa Denko K.K.)
Column temperature: 40° C.
Solvent: tetrahydrofuran (THF)
Flow rate: 1.0 mL/min
Standard sample: polystyrene (manufactured by Showa Denko K.K.)

[Preparation of Pattern Reversal Film Forming Composition]

Synthesis Example 1

Synthesis of Polysiloxane: TEOS/MTEOS (30/70)

8.93 g of tetraethoxysilane, 17.83 g of methyltriethoxysilane, and 40.14 g of acetone were charged into a flask. To the flask, a condenser was attached and a dropping funnel containing 8.50 g of a hydrochloric acid aqueous solution (0.01 mole/L) prepared in advance was fitted. At room temperature, the hydrochloric acid aqueous solution was gradually dropped into the flask and the resultant reaction mixture was stirred for a few minutes. Then, the reaction mixture was subjected to the reaction in an oil bath at 85° C. for 4 hours. After the completion of the reaction, the flask containing the reaction solution was left to be cooled down and was fitted to an evaporator. Ethanol that was generated during the reaction was removed to obtain a reaction product (polysiloxane). Further, using an evaporator, acetone was exchanged with 4-methyl-2-pentanol. Here, the solid content in the obtained reaction product was measured by a baking method, and as the result thereof, the solid content was 25%. The obtained product (solid content) had a weight average molecular weight (Mw) of 1,400.

Synthesis Example 2

Synthesis of Polysiloxane: TEOS/MTEOS (40/60)

13.89 g of tetraethoxysilane, 17.83 g of methyltriethoxysilane, and 47.58 g of acetone were charged into a flask. To the flask, a condenser was attached and a dropping funnel containing 10.21 g of a hydrochloric acid aqueous solution (0.01 mole/L) prepared in advance was fitted. At room temperature, the hydrochloric acid aqueous solution was gradually dropped into the flask and the resultant reaction mixture was stirred for a few minutes. Then, the reaction mixture was subjected to the reaction in an oil bath at 85° C. for 4 hours. After the completion of the reaction, the flask containing the reaction solution was left to be cooled down and was fitted to an evaporator. Ethanol that was generated during the reaction was removed to obtain a reaction product (polysiloxane). Further, using an evaporator, acetone was exchanged with 4-methyl-2-pentanol. Here, the solid content in the obtained reaction product was measured by a baking method, and as the result thereof, the solid content was 25%. The obtained product (solid content) had a weight average molecular weight (Mw) of 1,300.

Synthesis Example 3

Synthesis of Polysiloxane: TEOS/MTEOS (50/50)

20.83 g of tetraethoxysilane, 17.83 g of methyltriethoxysilane, and 57.99 g of acetone were charged into a flask. To the flask, a condenser was attached and a dropping funnel containing 12.61 g of a hydrochloric acid aqueous solution (0.01 mole/L) prepared in advance was fitted. At room temperature, the hydrochloric acid aqueous solution was gradually dropped into the flask and the resultant reaction mixture was stirred for a few minutes. Then, the reaction mixture was subjected to the reaction in an oil bath at 85° C. for 4 hours. After the completion of the reaction, the flask containing the reaction solution was left to be cooled down and was fitted to an evaporator. Ethanol that was generated during the reaction was removed to obtain a reaction product (polysiloxane). Further, using an evaporator, acetone was exchanged with 4-methyl-2-pentanol. Here, the solid content in the obtained reaction product was measured by a baking method, and as the result thereof, the solid content was 25%. The obtained product (solid content) had a weight average molecular weight (Mw) of 1,800.

Synthesis Example 4

Synthesis of Polysiloxane: TEOS/MTEOS (70/30)

24.31 g of tetraethoxysilane, 8.92 g of methyltriethoxysilane, and 57.99 g of acetone were charged into a flask. To the flask, a condenser was attached and a dropping funnel containing 11.11 g of a hydrochloric acid aqueous solution (0.01 mole/L) prepared in advance was fitted. At room temperature, the hydrochloric acid aqueous solution was gradually dropped into the flask and the resultant reaction mixture was stirred for a few minutes. Then, the reaction mixture was subjected to the reaction in an oil bath at 85° C. for 4 hours. After the completion of the reaction, the flask containing the reaction solution was left to be cooled down and was fitted to an evaporator. Ethanol that was generated during the reaction was removed to obtain a reaction product (polysiloxane). Further, using an evaporator, acetone was exchanged with 4-methyl-2-pentanol. Here, the solid content in the obtained reaction product was measured by a baking method, and as the result thereof, the solid content was 25%. The obtained product (solid content) had a weight average molecular weight (Mw) of 2,100.

Synthesis Example 5

Synthesis of polysiloxane: TEOS/MTEOS/PTMOS (65/30/5)

27.08 g of tetraethoxysilane, 10.70 g of methyltriethoxysilane, 1.98 g of phenyltrimethoxysilane, and 59.65 g of acetone were charged into a flask. To the flask, a condenser was attached and a dropping funnel containing 13.15 g of a hydrochloric acid aqueous solution (0.01 mole/L) prepared in advance was fitted. At room temperature, the hydrochloric acid aqueous solution was gradually dropped into the flask and the resultant reaction mixture was stirred for a few minutes. Then, the reaction mixture was subjected to the reaction in an oil bath at 85° C. for 4 hours. After the completion of the reaction, the flask containing the reaction solution was left to be cooled down and was fitted to an evaporator. Ethanol that was generated during the reaction was removed to obtain a reaction product (polysiloxane). Further, using an evaporator, acetone was exchanged with 4-methyl-2-pentanol. Here, the solid content in the obtained reaction product was measured by a baking method, and as the result thereof, the solid content was 25%. The obtained product (solid content) had a weight average molecular weight (Mw) of 2,000.

Synthesis Example 6

Synthesis of Polysiloxane: TEOS/MTEOS (20/80)

7.81 g of tetraethoxysilane, 26.75 g of methyltriethoxysilane, and 51.84 g of acetone were charged into a flask. To the flask, a condenser was attached and a dropping funnel containing 10.81 g of a hydrochloric acid aqueous solution (0.01 mole/L) prepared in advance was fitted. At room temperature, the hydrochloric acid aqueous solution was gradually dropped into the flask and the resultant reaction mixture was stirred for a few minutes. Then, the reaction mixture was subjected to the reaction in an oil bath at 85° C. for 4 hours. After the completion of the reaction, the flask containing the reaction solution was left to be cooled down and was fitted to an evaporator. Ethanol that was generated during the reaction was removed to obtain a reaction product (polysiloxane). Further, using an evaporator, acetone was exchanged with 4-methyl-2-pentanol. Here, the solid content in the obtained reaction product was measured by a baking method, and as the result thereof, the solid content was 23.50%. The obtained product (solid content) had a weight average molecular weight (Mw) of 1,300.

Synthesis Example 7

Synthesis of Polysiloxane: TEOS/MTEOS (10/90)

3.47 g of tetraethoxysilane, 26.75 g of methyltriethoxysilane, and 45.33 g of acetone were charged into a flask. To the flask, a condenser was attached and a dropping funnel containing 9.31 g of a hydrochloric acid aqueous solution (0.01 mole/L) prepared in advance was fitted. At room temperature, the hydrochloric acid aqueous solution was gradually dropped into the flask and the resultant reaction mixture was stirred for a few minutes. Then, the reaction mixture was subjected to the reaction in an oil bath at 85° C. for 4 hours. After the completion of the reaction, the flask containing the reaction solution was left to be cooled down and was fitted to an evaporator. Ethanol that was generated during the reaction was removed to obtain a reaction product (polysiloxane). Further, using an evaporator, acetone was exchanged with 4-methyl-2-pentanol. Here, the solid content in the obtained reaction product was measured by a baking method, and as the result thereof, the solid content was 25.45%. The obtained product (solid content) had a weight average molecular weight (Mw) of 1,200.

Synthesis Example 8

Synthesis of Polysiloxane: TEOS/MTEOS (5/95)

1.64 g of tetraethoxysilane, 26.75 g of methyltriethoxysilane, and 42.58 g of acetone were charged into a flask. To the flask, a condenser was attached and a dropping funnel containing 8.68 g of a hydrochloric acid aqueous solution (0.01 mole/L) prepared in advance was fitted. At room temperature, the hydrochloric acid aqueous solution was gradually dropped into the flask and the resultant reaction mixture was stirred for a few minutes. Then, the reaction mixture was subjected to the reaction in an oil bath at 85° C. for 4 hours. After the completion of the reaction, the flask containing the reaction solution was left to be cooled down and was fitted to an evaporator. Ethanol that was generated during the reaction was removed to obtain a reaction product (polysiloxane). Further, using an evaporator, acetone was exchanged with 4-methyl-2-pentanol. Here, the solid content in the obtained reaction product was measured by a baking method, and as the result thereof, the solid content was 27.3%. The obtained product (solid content) had a weight average molecular weight (Mw) of 1,300.

Synthesis Example 9

Synthesis of Polysiloxane: TEOS/MTEOS (1199)

0.32 g of tetraethoxysilane, 26.75 g of methyltriethoxysilane, and 40.59 g of acetone were charged into a flask. To the flask, a condenser was attached and a dropping funnel containing 8.22 g of a hydrochloric acid aqueous solution (0.01 mole/L) prepared in advance was fitted. At room temperature, the hydrochloric acid aqueous solution was gradually dropped into the flask and the resultant reaction mixture was stirred for a few minutes. Then, the reaction mixture was subjected to the reaction in an oil bath at 85° C. for 4 hours. After the completion of the reaction, the flask containing the reaction solution was left to be cooled down and was fitted to an evaporator. Ethanol that was generated during the reaction was removed to obtain a reaction product (polysiloxane). Further, using an evaporator, acetone was exchanged with 4-methyl-2-pentanol. Here, the solid content in the obtained reaction product was measured by a baking method, and as the result thereof, the solid content was 21.3%. The obtained product (solid content) had a weight average molecular weight (Mw) of 1,100.

Example 1 to Example 7, and Comparative Example 1 and Comparative Example 2

Pattern Reversal Film Forming Composition 5 g of each of the polysiloxanes prepared in Synthesis Example 1 to Synthesis Example 9 was dissolved in 30 g of an organic solvent (4-methyl-2-pentanol). Next, to the resultant solution, 0.375 g of benzyltriethylammonium chloride, 0.0375 g of maleic acid, and 0.625 g of a surfactant (manufactured by DIC Corporation; MEGAFAC R-30) were added and the resultant solution was filtered with a filter having a pore diameter of 0.1 μm to obtain each of the pattern reversal film forming compositions of Example 1 to Example 7, and Comparative Example 1 and Comparative Example 2.

[Performance Evaluation]

<1. Evaluation of Planarizing Property>

On a step substrate, each of the pattern reversal film forming compositions of Example 1 to Example 7, and Comparative Example 1 and Comparative Example 2 was applied using a spin coater under conditions of a rotation number of 1,500 rpm and a time of 60 seconds, and then, the resultant coating was dried on a hot plate of 110° C. for 1 minute to form a pattern reversal film having a film thickness of about 100 nm.

The used step substrate was a silicon substrate (available from Advance Co., Ltd.) composed of $SiO_2$ having a line and space having a height of 80 nm and a width of 115 nm formed thereon and the present step substrate was used for the sake of convenience instead of a substrate having a resist pattern formed thereon.

Further, using a step substrate on which an isolated line pattern having the same size of line and space as those of the above-mentioned step substrate is formed, in the same manner as described above, a pattern reversal film having a film thickness of about 100 nm was formed.

With respect to the obtained pattern reversal film, a shape of cross section was photographed by a cross-section SEM. The obtained SEM images are shown in FIG. 1 (in each photograph, the left half indicates a step substrate having a line and space pattern formed thereon and the right half indicates a step substrate having an isolated line pattern formed thereon) (Example 1 to Example 6, and Comparative Example 1 and Comparative Example 2).

Figure 2:
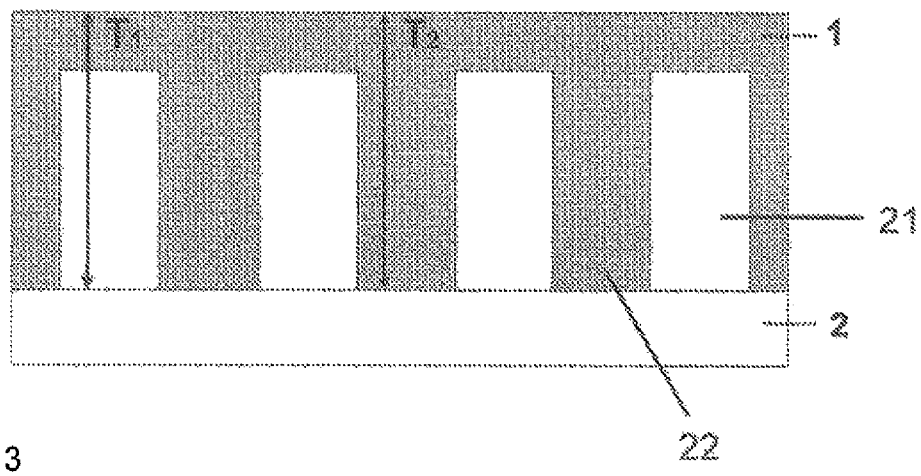
FIG. 2 schematically shows a pattern reversal film formed on a step substrate.

Based on the cross section SEM images (the left half (a line and space pattern) in FIG. 1), there was measured the film thickness difference between a distance $T_1$ (film thickness at a line part 21) from the surface of the substrate to the top face of the pattern reversal film and a distance $T_2$ (film thickness at a space part 22) (see FIG. 2). The obtained result thereof is shown in Table 1.

TABLE 1

Planarizing property evaluation

| Pattern reversal film forming composition* | | Planarizing property evaluation ($T_1$-$T_2$) |
|---|---|---|
| Example 1 | (Synthesis Example 1) | 2.5 nm |
| Example 2 | (Synthesis Example 2) | 2.5 nm |
| Example 3 | (Synthesis Example 3) | 2.7 nm |
| Example 4 | (Synthesis Example 6) | 2.0 nm |
| Example 5 | (Synthesis Example 7) | 1.5 nm |
| Example 6 | (Synthesis Example 8) | 1.5 nm |
| Example 7 | (Synthesis Example 9) | 1.7 nm |
| Comparative Example 1 | (Synthesis Example 4) | 10.6 nm |
| Comparative Example 2 | (Synthesis Example 5) | 24.8 nm |

*Synthesis Example No. in ( ) indicates a used polysiloxane.

As shown in FIG. 1, the pattern reversal films formed using the pattern reversal film forming compositions of Examples could advantageously coat the pattern on the step substrate. As shown also in Table 1, with respect to any one of the step substrate having a line and space pattern formed thereon and the step substrate having an isolated line pattern formed thereon, excellent planarizing properties could be obtained.

On the other hand, the pattern reversal film forming compositions of Comparative Example 1 (70% by mole) and Comparative Example 2 (65% by mole) each containing a polysiloxane synthesized from a silane compound having a content of tetraethoxysilane of more than 50% by mole, resulted in being poor in planarizing properties.

<2. Evaluation of Mixing with Resist>

On a silicon wafer, a resist material (manufactured by Sumitomo Chemical Co., Ltd.; PAR-855) was applied using a spin coater under conditions of a rotation number of 1,500 rpm and a time of 60 seconds, and then, the resultant coating was dried on a hot plate of 100° C. for 1 minute to form a resist film. The film thickness ($T_3$) of the resist film at this time was measured.

On the resist film, each of the pattern reversal film forming compositions of Example 1 to Example 7, and Comparative Example 1 and Comparative Example 2 was applied using a spin coater under conditions of a rotation number of 1,500 rpm and a time of 60 seconds, and then, the resultant coating was dried on a hot plate of 110° C. for 1 minute to form a pattern reversal film.

Next, the silicon wafer in which the resist film and the pattern reversal film were formed was immersed in 4-methyl-2-pentanol for 60 seconds for removing the pattern reversal film. Then, for removing a residual solvent, the silicon wafer was subjected to spin-drying and was dried on a hot plate of 100° C. for 1 minute. Then, the film thickness ($T_4$) of the resist film was measured again.

Using the values of the film thickness ($T_3$) of the resist film at formation of the resist film and the film thickness ($T_4$) of the resist film after removal of the pattern reversal film, the rate of film thickness change $[=[(T_3-T_4)/T_3]\times 100]$ was calculated. The obtained result is shown in Table 2.

TABLE 2

| Evaluation of mixing with resist | | |
|---|---|---|
| Pattern reversal film forming composition* | | Rate of film thickness change (%) |
| Example 1 | (Synthesis Example 1) | 0.5 |
| Example 2 | (Synthesis Example 2) | 0.1 |
| Example 3 | (Synthesis Example 3) | 0.0 |
| Example 4 | (Synthesis Example 6) | 0.2 |
| Example 5 | (Synthesis Example 7) | 0.1 |
| Example 6 | (Synthesis Example 8) | 0.2 |
| Example 7 | (Synthesis Example 9) | 0.3 |
| Comparative Example 1 | (Synthesis Example 4) | 0.6 |
| Comparative Example 2 | (Synthesis Example 5) | 0.1 |

*Synthesis Example No. in ( ) indicates a used polysiloxane.

As shown in Table 2, in any one of Example 1 to Example 7, and Comparative Example 1 and Comparative Example 2, the rates of film thickness change were not largely different from each other and advantageous results were obtained.

<3. Stability Evaluation of Formed Film>

On a silicon wafer, each of the pattern reversal film forming compositions of Example 1 to Example 7, and Comparative Example 1 and Comparative Example 2 was applied using a spin coater under conditions of a rotation number of 1,500 rpm and a time of 60 seconds, and then, the resultant coating was dried on a hot plate of 110° C. for 1 minute to form a pattern reversal film having a film thickness of about 100 nm.

Figure 3:
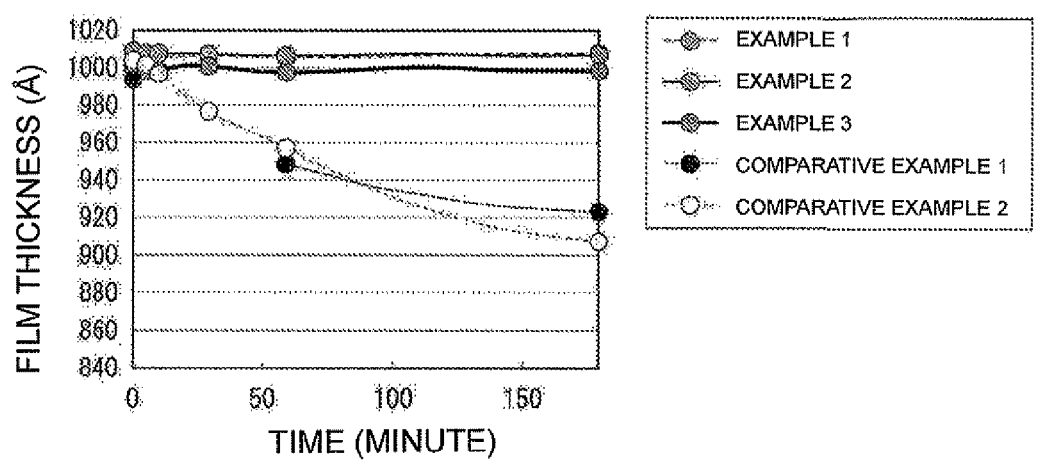
FIG. 3 shows a change in the film thickness with time passage of the pattern reversal films obtained using the pattern reversal film forming compositions of Example 1 to Example 3, and Comparative Example 1 and Comparative Example 2.

The silicon wafer as it was left at room temperature for 3 hours to measure the change with time passage in the film thickness that is the film thickness difference (decreased value) between the film thickness ($T_5$) immediately after film formation and the film thickness ($T_6$) after being left for 3 hours. The obtained result is shown in FIG. 3 (Example 1 to Example 3, and Comparative Example 1 and Comparative Example 2) and Table 3.

TABLE 3

| Stability evaluation | | |
|---|---|---|
| Pattern reversal film forming composition* | | Film thickness decreased value (Å) ($T_5$-$T_6$) |
| Example 1 | (Synthesis Example 1) | 0 |
| Example 2 | (Synthesis Example 2) | 1 |
| Example 3 | (Synthesis Example 3) | 1 |
| Example 4 | (Synthesis Example 6) | 1 |
| Example 5 | (Synthesis Example 7) | 2 |
| Example 6 | (Synthesis Example 8) | 1 |
| Example 7 | (Synthesis Example 9) | 2 |
| Comparative Example 1 | (Synthesis Example 4) | 70 |
| Comparative Example 2 | (Synthesis Example 5) | 95 |

*Synthesis Example No. in ( ) indicates a used polysiloxane.

As shown in FIG. 3 and Table 3, in each of the pattern reversal films obtained from the pattern reversal film forming compositions of Example 1 to Example 7 containing a polysiloxane synthesized from a silane compound in which the content of tetraethoxysilane was 1% by mole to 50% by mole, even after 3 hours had passed, the film thickness was hardly changed. On the other hand, each of the pattern reversal films obtained from the pattern reversal film forming compositions of Comparative Example 1 (70% by mole) and Comparative Example 2 (65% by mole) in which the content of tetraethoxysilane was more than 50% by mole, resulted in that the decreased value of the film thickness after 3 hours had passed was large.

<4. Preparation of Reversed Pattern>

First, on a silicon wafer, an organic resin film having a film thickness of 220 nm was formed. Next, on the organic resin film, a material for an anti-reflective coating (a composition containing a polymer having a structure unit of Formula (3) below) was applied and the resultant coating was baked under conditions of 205° C. and 60 seconds to form an organic anti-reflective coating having a film thickness of 20 nm.

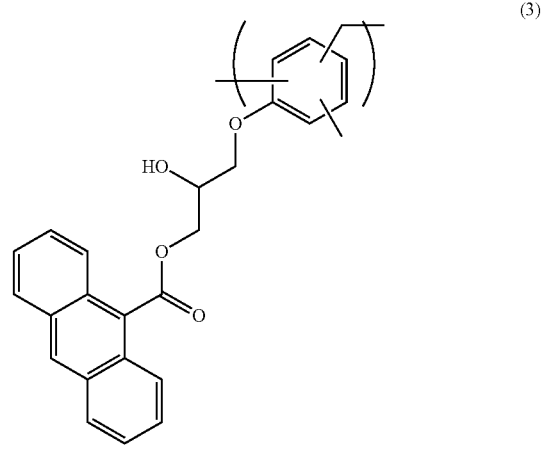

(3)

Next, on the organic anti-reflective coating, a resist material (manufactured by Sumitomo Chemical Co., Ltd.; PAR-855) was applied and the resultant coating was dried on a hot plate of 100° C. for 1 minute to form a resist film having a film thickness of 150 nm.

Then, through a mask with a desired pattern, the resist film was exposed to light using an exposing apparatus (manufactured by Nikon Corporation; NSR-S307E) and the resist film was baked at 105° C. for 60 seconds. Then, the resist film was subjected to developing treatment by an alkaline developer (tetramethylammonium hydroxide) for 60 seconds to form a resist pattern on the substrate.

Further, on the resist pattern and between the patterns, the pattern reversal film forming composition of Example 1 was applied, and then, the resultant coating was dried on a hot plate of 110° C. for 1 minute to form a pattern reversal film having a film thickness of about 160 nm.

Figure 4:
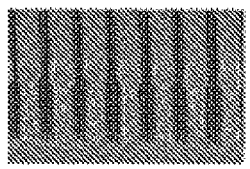
FIG. 4 shows an SEM image of the reversed pattern obtained using the pattern reversal film forming composition of Example 1.

The thus formed pattern reversal film was subjected to $CF_4$ etching (for 65 seconds) until the surface of the resist pattern was exposed. Next, by oxygen etching (for 90 seconds), the resist pattern was removed, and further, the organic anti-reflective coating and the organic resin film provided as underlayers of the resist pattern were etched. As the result, there was obtained a reversed pattern consisting of the pattern reversal film, the organic anti-reflective coating, and the organic resin film in this order from the uppermost layer. A cross section SEM image of the cross section shape of the obtained reversed pattern is shown in FIG. 4. Through the above processes, the objective reversed pattern was formed.

DESCRIPTION OF THE REFERENCE NUMERALS

1 ... Pattern reversal film
2 ... Step substrate
21 ... Line part of step substrate
22 ... Space part of step substrate

The invention claimed is:

1. A pattern reversal film forming composition consisting of:
a polysiloxane;
an additive selected from the group consisting of a pH controller, a condensation accelerator, a surfactant, a photoacid generator, and a quencher; and
an organic solvent,
wherein:
the polysiloxane is a product of a hydrolysis and/or condensation reaction of a silane compound containing a tetraalkoxysilane of Formula (1):

$$Si(OR^1)_4 \qquad (1),$$

(where $R^1$s are independently a $C_{1-4}$ alkyl) group; and
an alkoxysilane of Formula (2):

$$X_nSi(OR^2)_{4-n} \qquad (2),$$

(where:
X is selected from the group consisting of a methyl group, an ethyl group, a propyl group, a vinyl group, an allyl group, a 1-propenyl group, an isopropenyl group, a propenyl, group, an ethynyl group, a phenyl group, a tolyl group, a benzyl group, and a phenylethyl group;
$R^2$s are independently a $C_{1-4}$ alkyl group; and
n is an integer of 1 to 3; and
the tetraalkoxysilane is used in a ratio of 1 to 50% by mole based on the number of moles of the whole silane compound.

2. The pattern reversal film forming composition according to claim 1, wherein the tetraalkoxysilane is tetraethoxysilane.

3. The pattern reversal film forming composition according to claim 1, wherein the organic solvent is selected from the group consisting of $C_{4-10}$ alcohols and $C_{4-10}$ ethers.

4. The pattern reversal film forming composition according to claim 1, wherein the organic solvent is selected from the group consisting of butanol, pentanol, cyclopentanol, hexanol, cyclohexanol, and 4-methyl-2-pentanol.

5. A method of forming a pattern reversal film, the method comprising the process of:
forming a film by applying the pattern reversal film forming composition as claimed in claim 1 on a step substrate and by maintaining the resultant product at room temperature or by baking the resultant product at a temperature beyond room temperature up to 180° C.

6. The method of forming a pattern reversal film according to claim 5, wherein the step substrate is a substrate with a surface having a resist pattern formed thereon.

7. A method of forming a reversed pattern, the method comprising the processes of:
forming a resist pattern on a substrate to be processed;
applying the pattern reversal film forming composition as claimed in claim 1 on the resist pattern so as to coat the pattern of the resist pattern to form a pattern reversal film;
etching back the pattern reversal film to expose the surface of the resist pattern; and
removing the resist pattern to form a reversed pattern.

8. A method of forming a pattern reversal film, the method comprising the process of:
forming a film by applying the pattern reversal film forming composition as claimed in claim 2 on a step substrate and by maintaining the resultant product at room temperature or by baking the resultant product at a temperature beyond room temperature up to 180° C.

9. A method of forming a pattern reversal film, the method comprising the process of:
forming a film by applying the pattern reversal film forming composition as claimed in claim 3 on a step substrate and by maintaining the resultant product at room temperature or by baking the resultant product at a temperature beyond room temperature up to 180° C.

10. A method of forming a reversed pattern, the method comprising the processes of:
forming a resist pattern on a substrate to be processed;
applying the pattern reversal film forming composition as claimed in claim 2 on the resist pattern so as to coat the pattern of the resist pattern to form a pattern reversal film;
etching back the pattern reversal film to expose the surface of the resist pattern; and
removing the resist pattern to form a reversed pattern.

11. A method of forming a reversed pattern, the method comprising the processes of:
forming a resist pattern on a substrate to be processed;
applying the pattern reversal film forming composition as claimed in claim 3 on the resist pattern so as to coat the pattern of the resist pattern to form a pattern reversal film;
etching back the pattern reversal film to expose the surface of the resist pattern; and
removing the resist pattern to form a reversed pattern.

12. The method of forming a pattern reversal film according to claim 8, wherein the step substrate is a substrate with a surface having a resist pattern formed thereon.

13. The method of forming a pattern reversal film according to claim 9, wherein the step substrate is a substrate with a surface having a resist pattern formed thereon.

* * * * *